United States Patent [19]
Hundt et al.

[11] Patent Number: 5,491,889
[45] Date of Patent: Feb. 20, 1996

[54] APPARATUS FOR ACHIEVING PRINTED CIRCUIT BOARD PLANARITY

[75] Inventors: Michael J. Hundt, Double Oak; Krishnan Kelappan, Carrollton, both of Tex.

[73] Assignee: SGS-THOMSON Microelectronics, Inc., Carrollton, Tex.

[21] Appl. No.: 126,905

[22] Filed: Sep. 24, 1993

[51] Int. Cl.[6] ................................................. H05K 3/30
[52] U.S. Cl. ......................................... 29/834; 29/740
[58] Field of Search ............................... 29/740, 846, 834

[56] References Cited

U.S. PATENT DOCUMENTS

| | | | |
|---|---|---|---|
| 4,290,732 | 9/1981 | Taki et al. | 29/740 X |
| 4,738,025 | 4/1988 | Arnold | 29/740 X |
| 5,105,532 | 4/1992 | Fritsch | 29/740 |

FOREIGN PATENT DOCUMENTS

| | | | |
|---|---|---|---|
| 2-34985 | 2/1990 | Japan | 29/846 |
| 4-76930 | 3/1992 | Japan | 29/740 |
| 4-87345 | 3/1992 | Japan | 29/740 |
| 4-87347 | 3/1992 | Japan | 29/740 |

*Primary Examiner*—Carl J. Arbes
*Attorney, Agent, or Firm*—Renee M. Larson; Lisa K. Jorgenson; Richard K. Robinson

[57] ABSTRACT

According to the present invention, a system for placing surface mount components on a planar PCB has a placement apparatus which picks up a surface mount component to be placed on the PCB and moves it along the x and y axes to the desired PCB component location. The placement apparatus then moves a predetermined vertical distance towards the PCB. Next, a contact apparatus of the system having a spring bias force moves in a vertical direction towards the PCB until it makes contact with the PCB at a location in close proximity to the PCB component location. The contact apparatus has a spring bias force which holds the PCB planar at the PCB component location so that the surface mount component may be placed on the PCB.

16 Claims, 1 Drawing Sheet

APPARATUS FOR ACHIEVING PRINTED CIRCUIT BOARD PLANARITY

BACKGROUND OF THE INVENTION

1. Field of the Invention

The present invention relates generally to printed circuit boards (PCBs), and more specifically to an apparatus for achieving PCB planarity during placement of surface mount components.

2. Description of the Prior Art

A variety of conventional techniques are currently used to place surface mount components on printed circuit boards (PCBs). Key to the success of these methods is the ability to achieve and maintain PCB planarity. Unless PCB planarity is maintained, it becomes very difficult to control the contact force used during the placement of surface mount components on the PCB.

These planarity and contact force concerns are aggravated when surface mount components must be placed on PCBs having vias. For PCBs having vias, some conventional methods, such as the vacuum and clamp method, are not feasible at all; a vacuum may not be achieved in a board having holes through it. Additionally, it is common practice for small individual PCBs having vias to be grouped together in panel form because of the convenience which panels offer. Often a number of small, connected PCBs, which may vary in size from less than one inch, are grouped to form a panel which may be 9 inches×11 inches or more. After surface mount components are placed on the PCBs, is easy to perform reflow, attach, and inspection procedures before separating the individual PCBs. Although the panels are convenient to process, they lack sufficient mechanical rigidity and PCB planarity. Routing between the PCBs means that the panel as a whole is not rigid and it is therefore very difficult to ensure the requisite planarity of individual PCBs. And, because of the panel's lack of rigidity, it is usually held to a planar surface only at peripheral points, such as the four corners, and not at individual points of interest during placement of the surface mount components, thereby contributing further to a lack of planarity in individual PCBs.

SUMMARY OF THE INVENTION

It is therefore an object of the present invention to control the contact force used during the placement of surface mount components on printed circuit boards (PCBs) such that PCB planarity is achieved;

It is therefore further an object of the present invention to place surface mount components on PCBs arranged in panel form such that PCB planarity is achieved; and It is therefore further an object of the present invention to achieve PCB planarity using existing surface mount component placement technology.

Therefore, according to the present invention, PCB planarity is achieved during placement of a surface mount component through a spring bias contact apparatus which forces the PCB flat against a planar reference surface, such as a base plate, at a specific point of interest, i.e, the proximate point where the surface mount component is to be placed.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing, wherein:

DESCRIPTION OF THE INVENTION

Figure 1:
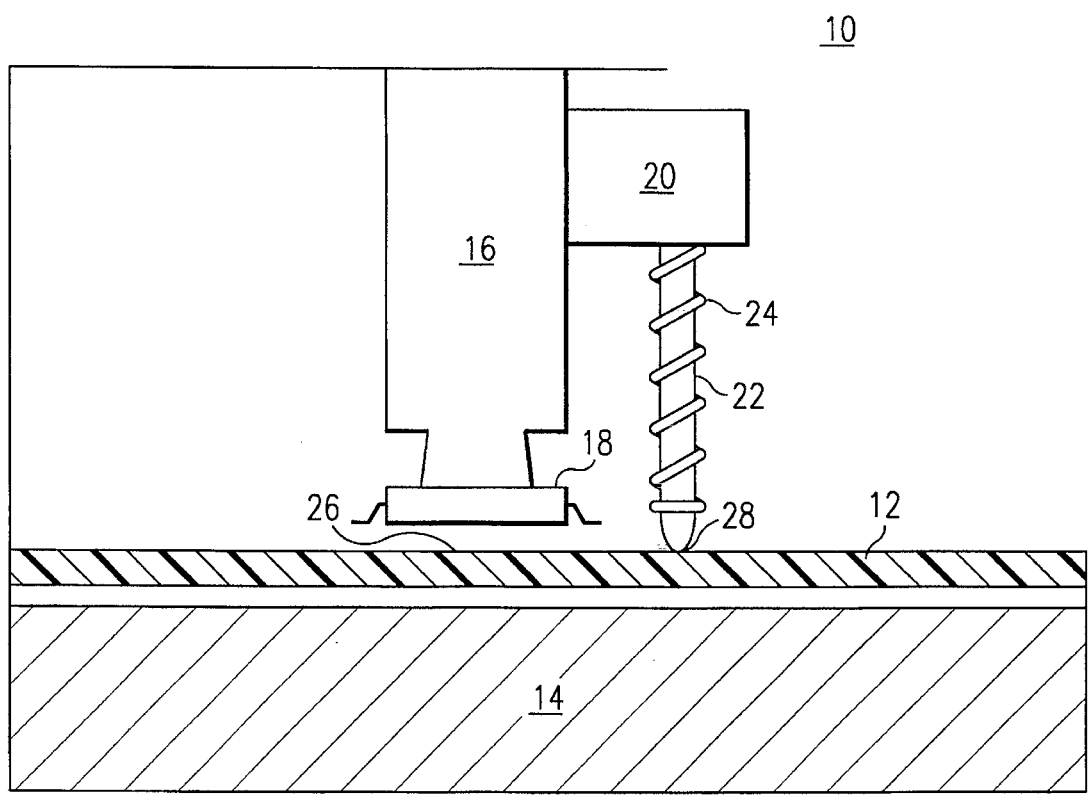
FIG. 1 is a drawing of an apparatus for achieving printed circuit board (PCB) planarity, according to the present invention.

When placing surface mount components on printed circuit boards (PCBs), it is necessary to control the contact force used to place the surface mount components, such that PCB planarity is achieved at the proximate point of interest. The present invention provides for a controlled contact force at a point on the PCB close to where the surface mount component is to be placed so that PCB planarity is achieved.

Referring to FIG. 1, an apparatus 10 for achieving printed circuit board (PCB) planarity, according to the present invention, is shown. PCB 12 rests on top of base plate 14 as shown. Base plate 14 is of exceptional planarity and serves as the planarity reference for apparatus 10. Pick and place head 16 is of the type commonly used in conventional placement techniques, such as the vacuum and clamp method, and provides accuracy along the x axis and y axis in placing a surface mount component 18 at a desired PCB component location 26. Attachment block 20 attaches spring loaded contact pin 22 to pick and place head 16. Attachment block 20 may attach contact pin 22 to pick and place head 16 in a number of ways and is of secondary importance to the present invention. Spring coil 24 wraps around contact pin 22, providing it with a bias spring force.

Pick and place head 16 moves to the x and y coordinates of the desired PCB component location and comes down a predetermined vertical distance towards PCB 12 such that surface mount component 18 is just above PCB 12. Then, spring loaded contact pin 22 moves in a vertical direction until it establishes contact with PCB 12 at a PCB contact location 28, which is in close proximity to PCB component location 26, as shown in FIG. 1. Because PCB 12 is assured of being planar only if it is flat with respect to base plate 14, the spring bias force of spring loaded contact pin 22 ensures that the PCB is in direct contact with base plate 14 at PCB component location 26 and PCB contact location 28. Thus, pick and place head 16 ensures placement accuracy along the x and y axes while spring loaded contact pin 22 ensures placement accuracy along the vertical, or z, axis. In this way, the exceptional planarity of base plate 14 is transferred to PCB 12 during the placement of surface mount device 18.

The spring constant of spring coil 24 is appropriately chosen so that the appropriate amount of force required to hold PCB 12 to base plate 14 is supplied to spring biased contact pin 22. Generally, the thicker PCB 12, the greater the spring constant of spring coil 24 needs to be.

FIG. 1 shows application of the present invention to a single PCB. Additionally, the present invention may also be readily used to place surface mount components on PCBs grouped together in a panel configuration, thereby addressing the special planarity considerations associated with panel PCBs, as discussed above in the Description of the Prior Art.

The present invention offers many advantages over prior art techniques of surface mount component placement. Contact pin 22 holds down PCB 12 at PCB contact location 28, and therefore ensures that the PCB will be planar at both PCB component location 26 and PCB contact location 28, because of the close proximity of PCB locations 26 and 28. Also, the present invention provides superior planarity to PCBs arranged in panel configuration. Thus, the convenience that panels offer may be realized while ensuring individual PCB planarity. Finally, the present invention is suitable for PCBs with or without vias.

While the invention has been particularly shown and described with reference to a preferred embodiment, it will be understood by those skilled in the art that various changes in form and detail may be made therein without departing from the spirit and scope of the invention. For instance, the spring loaded contact feature of the present invention makes it suitable for a variety of applications requiring precise vertical locating abilities. Examples of possible applications include drilling operations, metal stamping, and semiconductor testing.

What is claimed is:

1. A system for achieving printed circuit board (PCB) planarity during the placement of surface mount components, comprising:
    a planar base plate which provides a planar reference for the system;
    a PCB which is placed on the planar base plate;
    a placement apparatus which places a surface mount component at a PCB component location, defined by x and y planar coordinates; and
    a vertical contact apparatus, which is attached to the placement apparatus, that makes contact with the PCB at a PCB contact location and ensures that the PCB component location and the PCB contact location are planar by employing a spring bias force against the PCB at the PCB contact location.

2. The system of claim 1, wherein the placement apparatus is a pick and place head.

3. The system of claim 1, wherein the contact apparatus is a spring loaded contact pin encased in a spring coil.

4. The system of claim 1, wherein the PCB has vias.

5. The system of claim 1, wherein the PCB component location and the PCB contact location are in close proximity.

6. A system for achieving printed circuit board (PCB) planarity during the placement of surface mount components, comprising:
    a planar base plate which provides a planar reference for the system;
    a panel, having a plurality of PCBs, which is placed on the planar base plate;
    a placement apparatus which places a surface mount component at a PCB component location, defined by x and y planar coordinates on one of the PCBs; and
    a vertical contact apparatus, which is attached to the placement apparatus, that makes contact with the PCB at a PCB contact location and ensures that the PCB component location and the PCB contact location are planar by employing a spring bias force against the PCB at the PCB contact location.

7. The system of claim 6, wherein the placement apparatus is a pick and place head.

8. The system of claim 6, wherein the contact apparatus is a spring loaded contact pin encased in a spring coil.

9. The system of claim 6, wherein the PCB have vias.

10. The system of claim 6, wherein the PCB component location and the PCB contact location are in close proximity.

11. A method of placing surface mount components on a planar printed circuit board (PCB), comprising the steps of:
    placing the PCB on a planar base plate which provides a planar reference;
    picking up a surface mount component with a placement apparatus;
    moving the placement apparatus along the x and y axes to a PCB component location, defined by x and y planar coordinates;
    moving the placement apparatus a predetermined vertical distance along the z axis towards the PCB;
    moving a contact apparatus, having a spring bias force, a vertical direction along the z axis until contact is made with the PCB at a PCB contact location; and
    placing the surface mount component on the PCB at the PCB component location.

12. The method of claim 11, wherein the spring bias force ensures that the PCB is held planar at the PCB component location and the PCB contact location.

13. The method of claim 12, wherein the PCB component location and the PCB contact location are in close proximity.

14. The method of claim 11, wherein the placement apparatus is a pick and place head.

15. The method of claim 11, wherein the contact apparatus is a spring loaded contact pin encased in a spring coil.

16. The method of claim 11, wherein the PCB has vias.

* * * * *